(12) United States Patent
Kutkut (10) Patent No.: US 11,022,652 B2
(45) Date of Patent: Jun. 1, 2021

(54) DISTRIBUTED CLOUD BASED BATTERY MONITORING SYSTEM

(71) Applicant: SMART CHARGING TECHNOLOGIES, LLC, Orlando, FL (US)

(72) Inventor: Nasser Kutkut, Orlando, FL (US)

(73) Assignee: SMART CHARGING TECHNOLOGIES LLC, Orlando, FL (US)

( * ) Notice: Subject to any disclaimer, the term of this patent is extended or adjusted under 35 U.S.C. 154(b) by 476 days.

(21) Appl. No.: 15/922,127

(22) Filed: Mar. 15, 2018

(65) Prior Publication Data
US 2018/0267109 A1 Sep. 20, 2018

Related U.S. Application Data

(60) Provisional application No. 62/471,555, filed on Mar. 15, 2017.

(51) Int. Cl.
*G01R 31/3842* (2019.01)
*G01R 31/389* (2019.01)
(Continued)

(52) U.S. Cl.
CPC ....... *G01R 31/3842* (2019.01); *G01R 31/371* (2019.01); *G01R 31/389* (2019.01);
(Continued)

(58) Field of Classification Search
CPC .............. G01R 31/3842; G01R 31/389; G01R 31/396; G01R 31/371; H02J 7/0047; H04L 67/125; H04L 67/10; H01M 10/4257
See application file for complete search history.

(56) References Cited

U.S. PATENT DOCUMENTS

| 6,532,425 | B1 | 3/2003 | Boost et al. |
| 2005/0038614 | A1* | 2/2005 | Botts .................. G01R 31/3842 |
| | | | 702/63 |

(Continued)

FOREIGN PATENT DOCUMENTS

WO WO 2015/185890 * 12/2015 ................ H02J 7/35

OTHER PUBLICATIONS

Kutkut et al; U.S. Appl. No. 15/939,862, filed Mar. 29, 2018.
(Continued)

*Primary Examiner* — Regis J Betsch
(74) *Attorney, Agent, or Firm* — Allen, Dyer, Doppelt + Gilchrist, PA (57) ABSTRACT

A battery monitoring system is for a battery string(s) at a geographical location, where the battery string(s) includes a plurality of series-connected batteries. The system may include wireless battery monitors each associated with a respective battery, a wireless string monitor associated with the battery string(s), and a wireless access point for communicating with the wireless battery monitors and the wireless string monitor at the location. A battery monitoring cloud server may communicate with the at least one access point via a wide area network (WAN) to remotely determine a configuration of the batteries within the battery strings based upon the wireless battery monitors and the wireless string monitor, remotely collect diagnostic measurement data for the batteries from the wireless battery monitors and the wireless string monitors, and remotely process the collected diagnostic measurement data based upon the determined configuration of the batteries to determine fault conditions and generate alerts accordingly.

23 Claims, 6 Drawing Sheets

(51) Int. Cl.
*G01R 31/396* (2019.01)
*G01R 31/371* (2019.01)
*H02J 7/00* (2006.01)
*H04L 29/08* (2006.01)
*H01M 10/42* (2006.01)

(52) U.S. Cl.
CPC .......... *G01R 31/396* (2019.01); *H02J 7/0047* (2013.01); *H04L 67/125* (2013.01); *H01M 10/4257* (2013.01); *H04L 67/10* (2013.01)

(56) References Cited

U.S. PATENT DOCUMENTS

2005/0071093 A1* 3/2005 Stefan ................ G01R 19/2513
702/60
2006/0250233 A1* 11/2006 Powell ................. H02J 7/0047
340/539.1

OTHER PUBLICATIONS

Nasser Kutkut; U.S. Appl. No. 15/944,010, filed Apr. 3, 2018.
Nasser Kutkut; U.S. Appl. No. 15/067,283, filed Mar. 11, 2016.
Nasser Kutkut; U.S. Appl. No. 15/952,358, filed Apr. 13, 2018.
Kutkut et al.; U.S. Appl. No. 15/952,900, filed Apr. 13, 2018.
Nasser Kutkut; U.S. Appl. No. 12/942,733, filed Apr. 8, 2015.

* cited by examiner

DISTRIBUTED CLOUD BASED BATTERY MONITORING SYSTEM

RELATED APPLICATIONS

This application claims the benefit of provisional application Ser. No. 62/471,555 filed Mar. 15, 2017, which is hereby incorporated herein in its entirety by reference.

TECHNICAL FIELD

The present invention relates generally to battery systems, and more specifically to a cloud-based battery monitoring system and related methods.

BACKGROUND

Batteries are utilized in many applications, such as for storing energy from photovoltaic systems, or to provide backup power when an AC power grid is down. Such applications may include solar power systems, telecommunications facilities, uninterruptible power supplies (UPS), etc. The batteries may be arranged in "strings" which include a plurality of series-connected batteries. The battery strings may in turn be connected in parallel.

It may be desirable to monitor the status of such battery strings to make sure that they are ready in case of a power outage or other event. One example battery plant monitoring system is disclosed in U.S. Pat. No. 6,532,425 to Boost et al. The reference describes a system for monitoring performance of one or more batteries in a battery plant facility. A set of sensors for each battery are used to measure a plurality of battery operation parameters including the battery current, battery voltage, and internal battery temperature of each battery. A processor generates, for each battery, a plurality of battery status parameters including a true age parameter and a float capacity parameter. During a float period, the true age parameter is updated based on elapsed time corrected for battery temperature history, and the float capacity is updated based on the most recent true age parameter. During a discharge period, the float capacity parameter is updated based on the evolution of plant voltage during the discharge. After the discharge period, at the beginning of a subsequent float period, the true age parameter is updated based on the float capacity parameter determined during the immediately previous discharge period.

Other battery monitoring systems have been disclosed. Most of these systems include battery module or cell sensors, battery string current sensors, and a system controller. These controllers are typically dedicated to single battery strings or parallel connected strings. These controllers typically incorporate microprocessors, data storage, and various peripherals for downloading data and configuring the system, which adds to system cost. Almost all data processing and data storage is embedded in the system controllers. This further increases the performance and cost requirements for the system controllers. Many of these systems are wired, where the battery module/cell sensor and string current sensor are connected to the system controller, and some use wireless communication to communicate with the system controller. Since system controllers are dedicated for a preset number of battery strings, these monitoring systems take considerable time to install and configure at a customer's site, which greatly increases installation costs. In fact, the installation costs of many battery monitoring systems can far exceed the battery monitoring system cost, which makes battery monitoring uneconomical in many applications.

Due to the limitations and cost of many existing battery monitoring systems, further improvements may be desirable for remote battery monitoring in certain applications.

SUMMARY

A battery monitoring system is for at least one battery string at a geographical location, where the least one battery string includes a plurality of series-connected batteries. The system may include a plurality of wireless battery monitors each associated with a respective battery, a wireless string monitor associated with the at least one battery string, a wireless access point for communicating with the wireless battery monitors and the wireless string monitor at the location. The system also includes a battery monitoring cloud server for communicating with the at least one access point via a wide area network (WAN) to remotely determine a configuration of the batteries within the battery strings based upon the wireless battery monitors and the wireless string monitor, remotely collect diagnostic measurement data for the batteries from the wireless battery monitors and the wireless string monitors, and remotely process the collected diagnostic measurement data based upon the determined configuration of the batteries to determine battery fault conditions and string fault conditions, and generate alerts based thereon.

More particularly, the battery monitoring cloud server may be further configured to remotely update the battery configuration based upon an addition or removal of wireless battery monitors and wireless string monitors over time. Furthermore, the battery monitoring cloud server may further be configured to remotely cause the wireless battery monitors and wireless string monitor to initiate the battery diagnostic measurements and string diagnostic measurements, respectively, based upon the determined battery configuration.

By way of example, the wireless battery monitors may be configured to measure at least one of battery voltage, battery temperature, a change in battery voltage over time, a maximum battery voltage, a battery minimum voltage, and a battery internal resistance. Also by way of example, the wireless string monitor may be configured to measure at least one of a battery string voltage, a battery string current, a maximum string voltage, a minimum sting voltage, a maximum charge current, and a maximum discharge current.

In addition, the wireless battery monitors and wireless string monitor may be configured to locally store the collected diagnostic measurement data until collected by the battery monitoring cloud server. Additionally, a mobile wireless communications device may be included and configured to register the wireless battery monitors with respective batteries, and register the wireless string monitor with the at least one battery string. Furthermore, the at least one battery string may comprise a plurality thereof connected in parallel in a battery pack, and the wireless access point may comprise a wireless local area network (WLAN) access point or a cellular access point.

A related battery monitoring method is for at least one battery string at a geographical location. The method may include coupling a plurality of wireless battery monitors each to a respective battery, and coupling a wireless string monitor to the at least one battery string. The method may also include, at a battery monitoring cloud server, communicating with the at least one access point via a wide area network (WAN) to remotely determine a configuration of the batteries within the battery strings based upon the wireless battery monitors and the wireless string monitor, remotely collect diagnostic measurement data for the batteries from the wireless battery monitors and the wireless string monitors, and remotely process the collected diagnostic measurement data based upon the determined configuration of the batteries to determine battery fault conditions and string fault conditions, and generate alerts based thereon.

DETAILED DESCRIPTION

Figure 1:
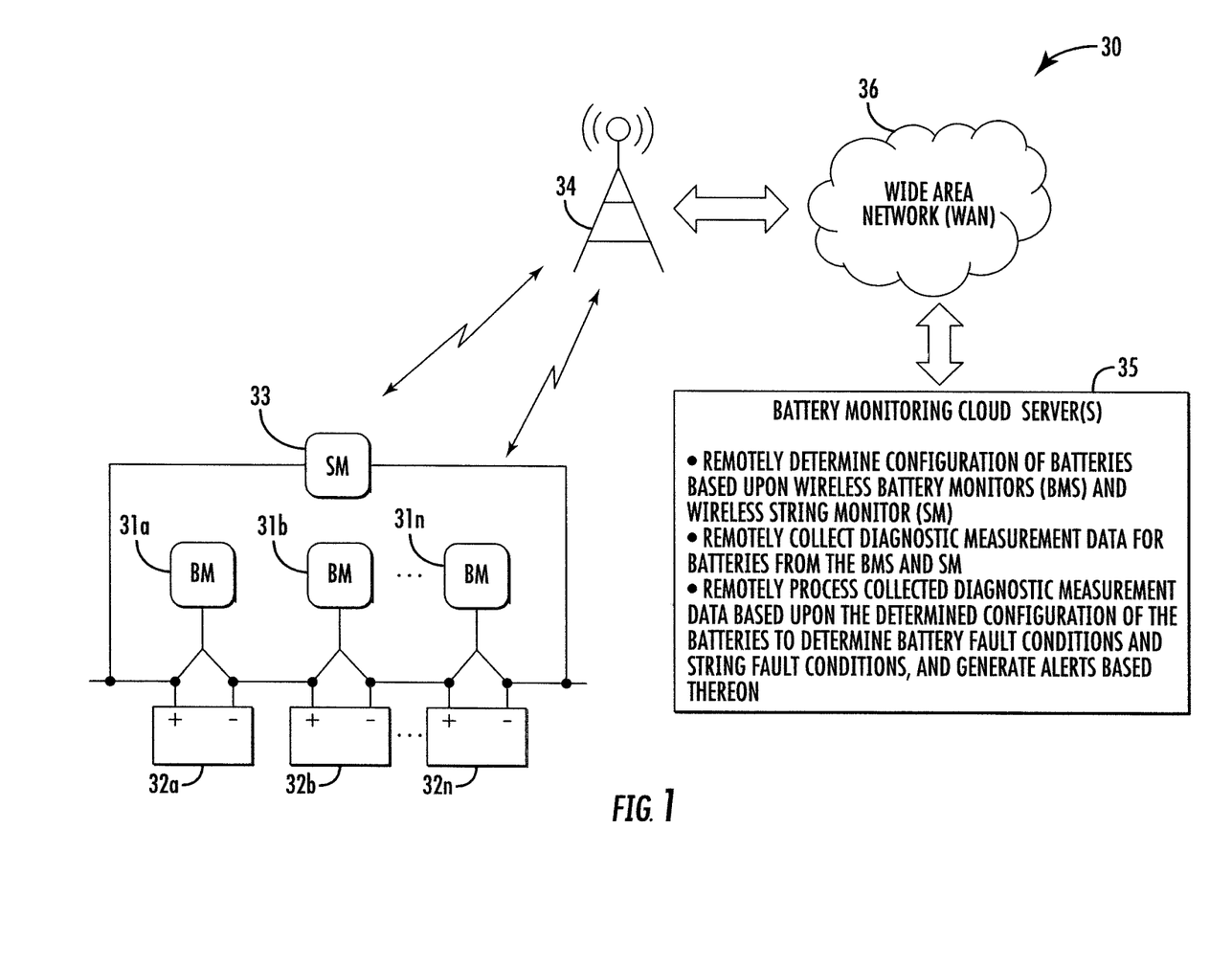
FIG. 1 is a schematic block diagram of a cloud-based battery monitoring system in accordance with an example aspect.

Referring now to FIG. 1, a distributed cloud-based battery monitoring system 30 and associated method aspects are first described. In accordance with an example embodiment, the battery monitoring system 30 illustratively includes wireless battery cell/module monitors (BM) 31a-31n (generally referred to as battery monitors 31 herein) for respective battery cell/modules 32a-32n (generally referred to as batteries 32 herein). The system 30 further illustratively includes a wireless string monitor (SM) 33, which may be a string current and/or voltage monitor for a string configuration of the batteries 32, as will be discussed further below.

The system 30 also further illustratively includes a wireless access point (AP) 34, and one or more battery monitoring cloud servers 35 which communicate with the battery monitors 31, 33 via the access point and a wide area network (WAN) 36, such as the internet. In some implementations the cloud server 35 may implemented as part of a cloud service. More particularly, a cloud application (cloud app) 40 (see FIG. 3) may be run on a cloud computing platform or server/server cluster, such as Amazon Web Services (AWS) or other suitable cloud computing platforms. More particularly, the cloud app 40 may be included in a non-transitory computer-readable medium and have computer executable instructions for causing the cloud server(s) to perform the functions or operations described herein.

Figure 2:
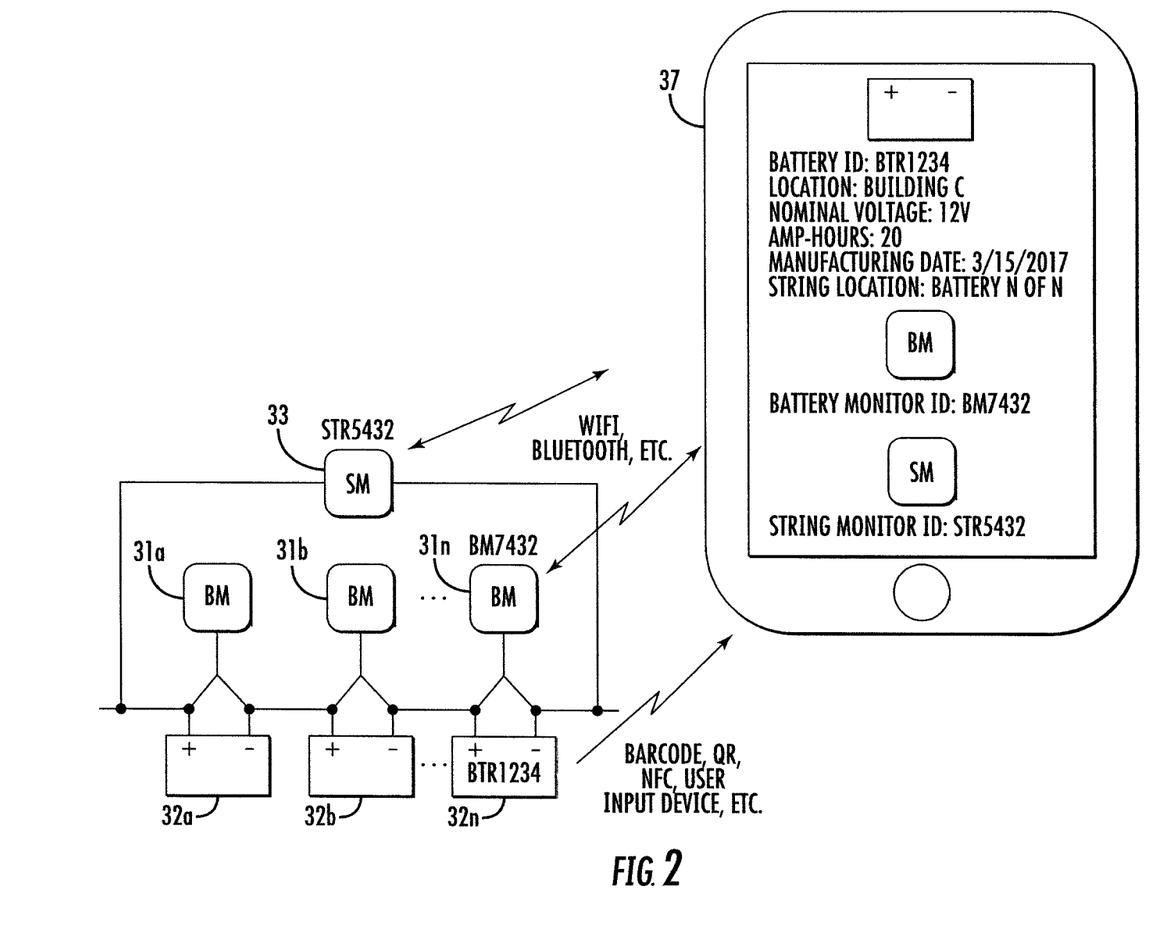
FIG. 2 is a schematic block diagram of a mobile device which may be used for registering wireless battery monitors and string monitors with respective batteries in the system of FIG. 1.

Referring additionally to FIG. 2, in some embodiments a computing device 37 running a software application (app) may be connected to the battery monitoring cloud server for registering the monitors 31, 33 and the batteries 32 present at the given geographical location, and subsequently monitoring the batteries via the battery monitoring cloud server 35, as will be discussed further below. In the illustrated example, the computing device 37 is a tablet computer, although other suitable computing devices may be used in other embodiments, such as smartphones, laptop and desktop computers, as well as other suitable mobile or stationary devices. The battery monitoring cloud server(s) 35 may include a collection of data and resources (e.g., hardware, data and/or software) provided and maintained by an off-site or off-premise party (e.g., third party), so that the collection of data and resources may be accessed by an identified user via a network.

By way of example, the configuration of the monitors 31, 33 may be based upon monitor serial numbers. Upon installation, the serial number of the monitors 31 and 33 may be scanned/entered using the computing device 37 connected to the cloud app 40 running on the cloud server(s) 35. In the illustrated example, the batteries 32a-32n are series-connected in a string, and the battery monitors 31a-31n are respectively connected to the batteries. Here, the battery 32n (which has an ID or serial number BTR1234) is associated with its respective battery monitor 31n (serial number BM7432). Batteries 32 may be registered by scanning a barcode, QR code, or via short-range wireless communication such as RFID or NFC, for example, with the device 37. Of course, the battery's information may be manually input to the device 37 as well (e.g., via a touch screen, keyboard, etc.). The computing device 37 may communicate the battery 32 and monitor 31, 33 information to the cloud server(s) 35 via the access point 34 and WAN 36.

The serial number of the battery monitors 31 may be associated with a battery 32, battery string, and/or battery serial number or ID, as shown in the illustrated example. Other information which may be communicated to the cloud server(s) 35 may include: battery cell/battery module location within a battery pack or string; battery module/battery cell serial number, and site name/site location. In addition, battery/cell parameters, such as nominal voltage, amp-hours, manufacturing date, etc. may also be saved. These are collectively referred to as configuration data. Upon entering each monitor/sensor record, the configuration data may be sent to the cloud. In the present example, the battery 32n is located in Building C, has a nominal voltage of 12V, and a 20 amp-hour rating with a manufacturing date of Mar. 15, 2017. Moreover, the battery 32n is the nth battery in a string of N batteries (i.e., it is the last battery in the string). However, it should be noted that the charging system may be used with numerous types and configurations of batteries in different embodiments.

In one example implementation, all battery and string configurations may be saved in the cloud, with no battery IDs or configurations being stored locally. Moreover, all battery data and analytics may be performed in the cloud.

Saving configuration data in the cloud and having all battery analytics performed by the cloud advantageously eliminates the need for a dedicated and costly system controller, and simplifies the installation process. The access point 34 may be relatively simpler and cheaper than a typical system controller, since it may have lower processing power and reduced data storage capacities since all the data is relayed to the cloud and no analytics need be performed locally. Furthermore, a significant benefit of the present approach is that most typical system controllers are designed to monitor a preset number of battery cells and/or battery strings due to the demand for increasing demand for higher local processing power and data storage with larger numbers of battery cells and battery strings. The cloud server(s) 35 may monitor a potentially unlimited number of battery cells configured into any number of battery strings and/or packs of parallel connected strings, and in a scalable fashion.

Various battery data and analytics and processing may be performed by the cloud application including, but not limited to: real-time battery cell, string, and pack voltages and temperatures; battery string float, charge, and discharge currents; battery cell impedances; and historical battery cell, string, and pack discharge logs.

The access point 34 may further include a wireless transceiver to communicate with the monitors 31, 33 via a local wireless network, for example. Moreover, a backhaul transceiver may also be provided to communicate with the cloud server(s) 35. By way of example, the local wireless network may be Wi-Fi, ZigBee, or sub GHz ISM band. Also by way of example, the backhaul may be via Ethernet, Wi-Fi, cell, or other wired or wireless connection to the internet.

Figure 3:
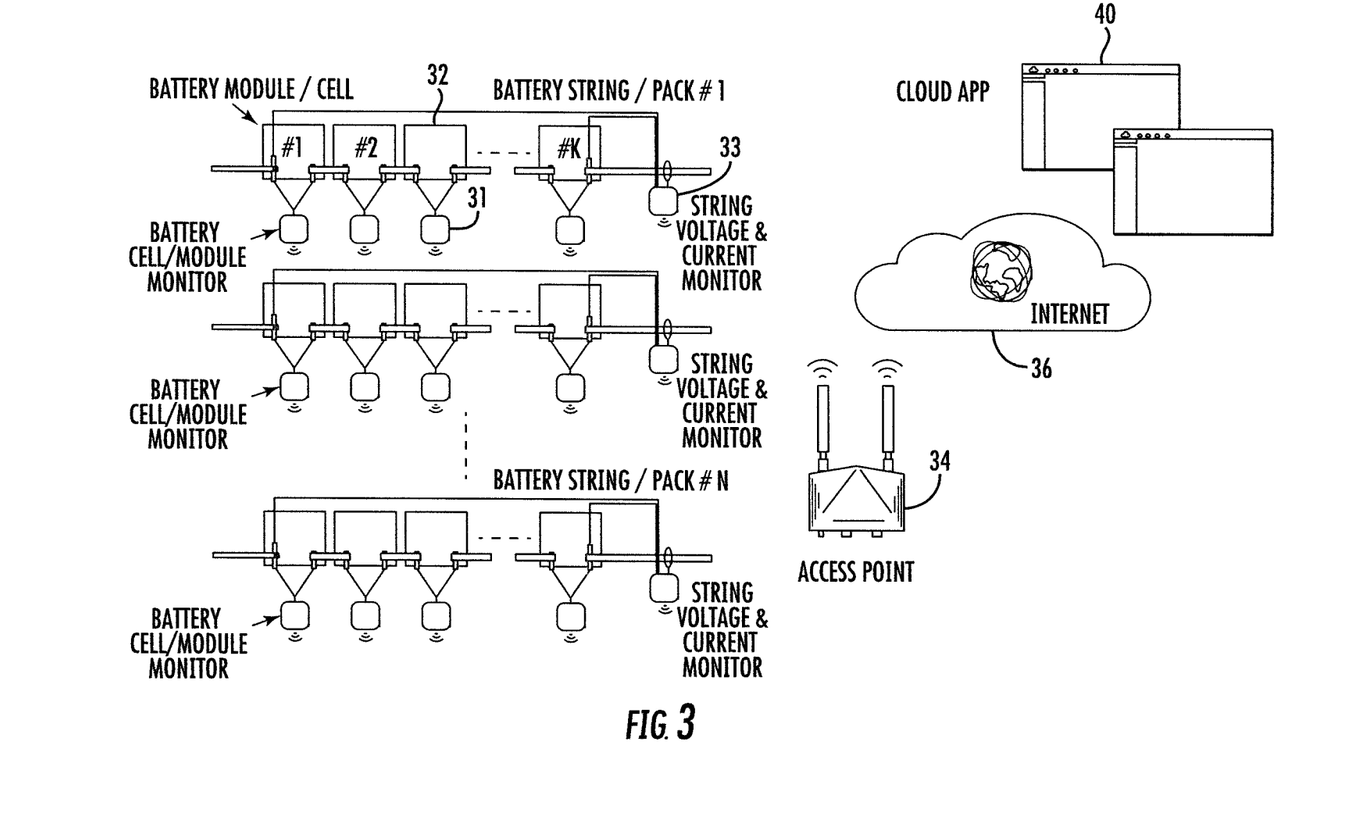
FIG. 3 is a schematic block diagram of another example cloud-based battery monitoring system in accordance with an example embodiment.

In an example implementation, each monitor 31, 33 may be a standalone sensor that logs and saves its own data based on measured parameters. The wireless battery cell/module monitors 31 may measure one or more of the following: battery module/cell voltage; temperature; and change in battery voltage (dv/dt), max voltage, min voltage, battery internal resistance, etc. The wireless string monitor 33 may measure one or more of battery pack/string voltage, pack or string current, max string voltage, min string voltage, maximum charge/discharge current, etc. Each monitor 31, 33 may process and save its records locally at fixed or variable sample time intervals. Moreover, data records may be initiated by and/or sent to the cloud server(s) 35 upon request or on a schedule. The cloud app 40 may configure the battery modules/cells 32 into battery strings and packs based on the saved configurations that associates each monitor 31 and/or 33 serial numbers with its respective configuration data.

The access point 34 may communicate with all battery monitors 31, 33 within a given geographical site or location. The access point 34 may communicate with one monitor 31, 33 at a time, a group of monitors, or all monitors at once (via a broadcast command). In one example implementation, a round-robin (RR) scheduling algorithm may be employed, where data is collected or pulled from all monitors 31, 33 at a given site in a circular order without preset sequence or priority. This helps to minimize wireless channel collisions and to ensure channel availability, although other suitable approaches may also be used in different embodiments.

Unlike existing battery monitoring systems, the access point 34 need not be dedicated to a single string or preset number of battery strings. The access point 34 communicates with all monitoring/sensor devices regardless of which string they are installed at. One access point 34 may be dedicated to a whole battery monitoring site employing any number of battery strings in one or more packs, although wireless range extenders or multiple wireless routers may be used in some implementations. In the example illustrated in FIG. 3, a plurality of N battery packs are present, each of which includes a plurality of battery strings connected in parallel, and the monitors 31, 33 associated with these batteries all communicate with the cloud app 40 via the access point 34.

The access point 34 may collect or pull data from all of the monitoring devices 31, 33 anonymously in some embodiments. No association between the monitor data and the respective string need be made by the access point 34. The access point 34 may also send a request to an individual monitor 31, 33 or groups of monitors using the monitoring devices' serial numbers as unique addresses. The monitoring devices 31, 33 may respond to requests (which may be initiated by the cloud app 40) and send corresponding data records to the access point 34.

In one example implementation, data records received from each monitor 31, 33 may be tagged with the monitor serial number and pushed to the cloud app 40. Data records may also be saved locally for redundancy in case the backhaul channel is lost or is unavailable. This data may optionally be erased from the local data store or written over after it has been successfully uploaded to the cloud server(s) 35, if desired.

The cloud app 40 may tag the received data records from each monitor with the battery ID and or cell ID, string ID, and site ID based on the serial number tag and the pre-saved configuration data for each serial number, for example. The cloud app 40 may further aggregate individual monitoring data records into respective strings and packs. By way of example, the cloud app 40 may aggregate data per site, per customer having multiple sites, per service dealer servicing multiple customers and multiple sites, for example.

The cloud app 40 may also initiate battery diagnostic tests. More particularly, the cloud app 40 may send to the access point 34 the battery string ID and the corresponding cell IDs that need to initiate a given test, such as battery impedance internal resistance. Once the cloud app 40 receives a request from the cloud app 40, it may send a global broadcast to the respective monitors 31, 33 to initiate the test. The access point 34 may then pull test data from each individual monitor and send it back to the cloud server(s) 35.

All data analytics and alerts may be performed on the cloud by the cloud server(s) 35. That is, no data processing needs to be performed locally where the batteries are located. Email or other suitable alerts may be sent by the cloud app 40 to registered users (e.g., at the computing device 37).

Figure 4:
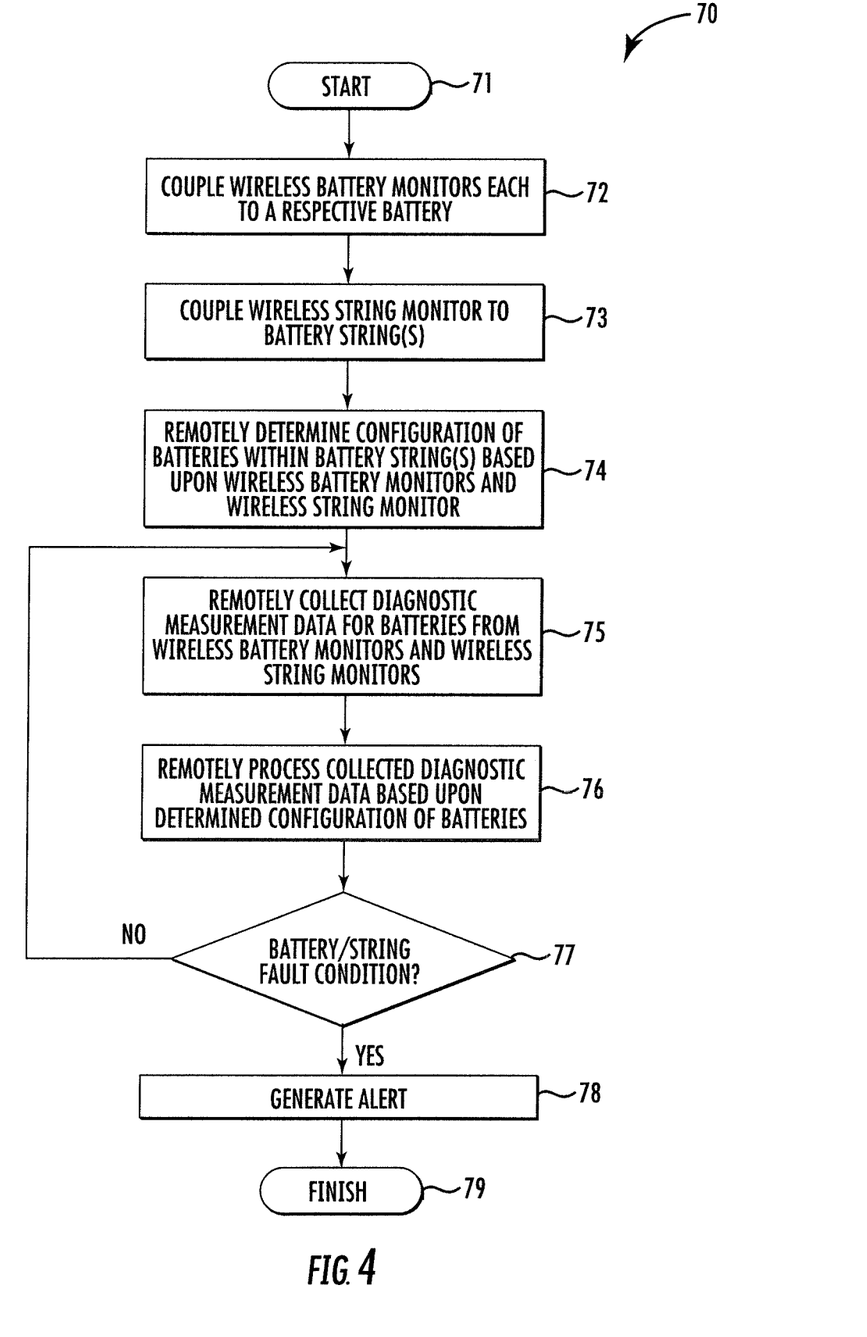
FIGS. 4-6 are flow diagrams illustrating method aspects associated with the system of FIG. 1.

Referring additionally to FIG. 4, related method aspects associated with the system 30 are now described with reference to the flow diagram 70. Beginning at Block 71, the method begins with coupling a plurality of wireless battery monitors 33 each to a respective battery 32, and coupling a wireless string monitor 33 to the battery string. The cloud server(s) 35 communicates with the access point 34 via the WAN 36 to remotely determine a configuration of the batteries 32 within the battery string(s) based upon the wireless battery monitors 31 and the wireless string monitor 33 (Block 74), remotely collect diagnostic measurement data for the batteries from the wireless battery monitors and the wireless string monitors (Block 75), and remotely process the collected diagnostic measurement data based upon the determined configuration of the batteries, at Block 77. If a battery fault condition or string fault condition is determined by the cloud server(s) 35, at Block 77, an alert may be generated as discussed above, at Block 78. The method of FIG. 4 illustratively concludes at Block 79.

Figure 5:
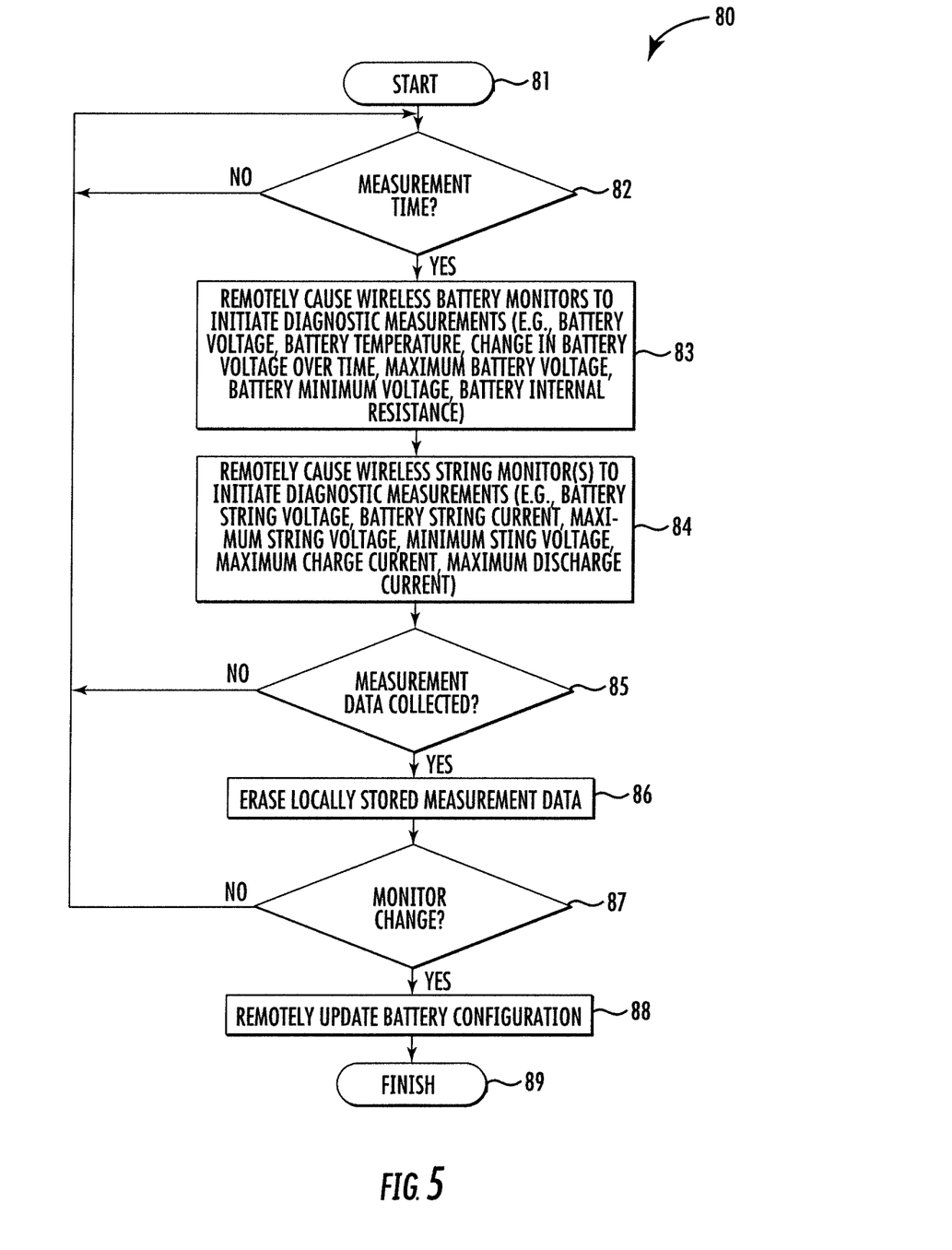

Further method aspects are now discussed with reference to the flow diagram 80 of FIG. 5. Beginning at Block 81, the battery monitoring cloud server 35 may remotely cause the wireless battery monitors 31 and wireless string monitor 33 to initiate the battery diagnostic measurements and string diagnostic measurements, respectively, based upon a schedule or measured time interval, at Blocks 82-84, as discussed above. Furthermore, as also noted above, collected diagnostic measurement data may be locally stored by the wireless battery monitors 31 and wireless string monitors 33, and may optionally be erased or overwritten after being collected by the battery monitoring cloud server 35, at Blocks 85-86. Furthermore, the battery monitoring cloud server 35 may also remotely update the battery configuration based upon an addition or removal of wireless battery monitors 31 and wireless string monitors 33 over time, at Block 87-88, which illustratively concludes the method steps of FIG. 5 (Block 89).

Figure 6:
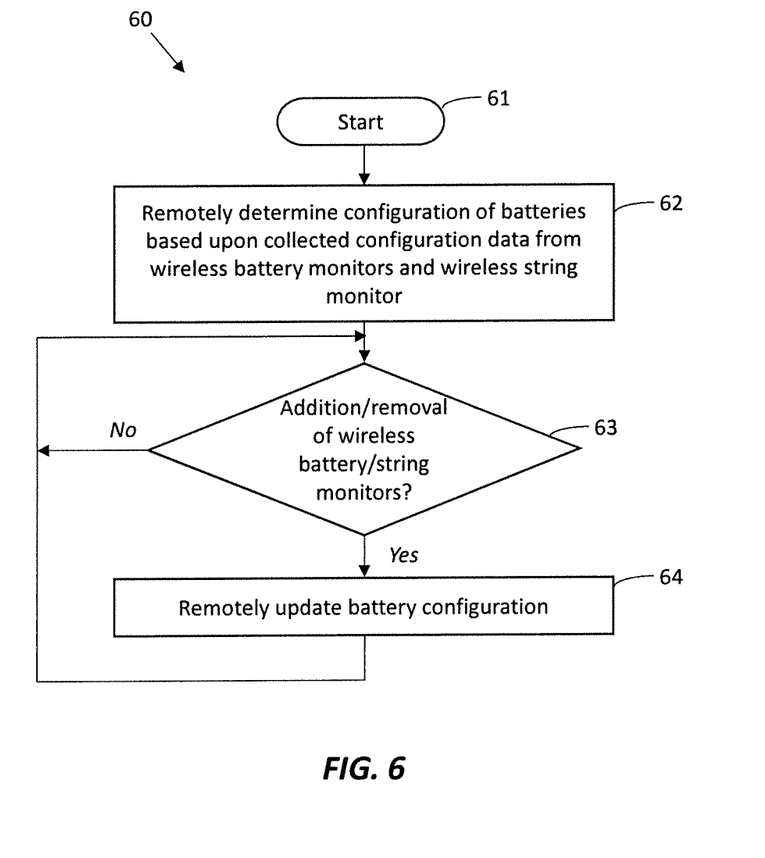

Additional method aspects are now discussed with reference to the flow diagram 60 of FIG. 6. Beginning at Block 61, the battery monitoring cloud server 35 remotely determines a configuration of the batteries 32a-32n based upon the collected configuration data from the wireless battery monitors 31 and the wireless string monitor 33 (Block 62), as discussed further above. Furthermore, as wireless battery monitors 31 and wireless string monitors 33 are added or removed over time (Block 63), the battery monitoring cloud server 35 is further configured to remotely update the battery configuration (Block 64) in a similar fashion to the initial configuration discussed above.

Many modifications and other embodiments will come to the mind of one skilled in the art having the benefit of the teachings presented in the foregoing descriptions and the associated drawings. Therefore, it is understood that the disclosure is not to be limited to the specific embodiments disclosed, and that modifications and embodiments are intended to be included within the scope of the appended claims.

That invention claimed is:

1. A battery monitoring system for at least one battery string at a geographical location, the least one battery string comprising a plurality of series-connected batteries, the system comprising:
    a plurality of wireless battery monitors each associated with a respective battery;
    a wireless string monitor associated with the at least one battery string;
    a wireless access point for communicating with the wireless battery monitors and the wireless string monitor at the location; and
    a battery monitoring cloud server for communicating with the at least one access point via a wide area network (WAN) to
        receive configuration data and diagnostic measurement data collected by the wireless access point from the wireless battery monitors and wireless string monitors and without local storage of the configuration data at the geographic location,
        remotely determine a configuration of the batteries including a location of the batteries within the battery strings based upon the collected configuration data from the wireless battery monitors and the wireless string monitor, and
        remotely process the collected diagnostic measurement data based upon the determined configuration of the batteries to determine battery fault conditions and string fault conditions, and generate alerts based thereon.

2. The battery monitoring system of claim 1 wherein the battery monitoring cloud server is further configured to remotely update the battery configuration based upon an addition or removal of wireless battery monitors and wireless string monitors over time.

3. The battery monitoring system of claim 1 wherein the battery monitoring cloud server is further configured to remotely cause the wireless battery monitors and wireless string monitor to initiate the battery diagnostic measurements and string diagnostic measurements, respectively, based upon the determined battery configuration.

4. The battery monitoring system of claim 1 wherein the wireless battery monitors are configured to measure at least one of battery voltage, battery temperature, a change in battery voltage over time, a maximum battery voltage, a battery minimum voltage, and a battery internal resistance.

5. The battery monitoring system of claim 1 wherein the wireless string monitor is configured to measure at least one of a battery string voltage, a battery string current, a maximum string voltage, a minimum string voltage, a maximum charge current, and a maximum discharge current.

6. The battery monitoring system of claim 1 wherein the wireless battery monitors and wireless string monitors are configured to locally store the collected diagnostic measurement data until collected by the battery monitoring cloud server.

7. The battery monitoring system of claim 1 further comprising a mobile wireless communications device configured to register the wireless battery monitors with respective batteries, and register the wireless string monitor with the at least one battery string.

8. The battery monitoring system of claim 1 wherein the at least one battery string comprises a plurality of substrings connected in parallel in a battery pack.

9. The battery monitoring system of claim 1 wherein the wireless access point comprises a wireless local area network (WLAN) access point or a cellular access point.

10. A battery monitoring system for a plurality of battery strings at a geographical location coupled together in parallel in a battery pack, the battery strings each comprising a plurality of series-connected batteries, the system comprising:
    a plurality of wireless battery monitors each associated with a respective battery;
    a respective wireless string monitor associated with each battery string;
    a wireless access point for communicating with the wireless battery monitors and the wireless string monitor at the location via a wireless local area network (WLAN); and
    a battery monitoring cloud server for communicating with the at least one access point via a wide area network (WAN) to
        receive configuration data and diagnostic measurement data collected by the access point from the wireless battery monitors and wireless string monitors and without local storage of the configuration data at the geographic location,
        remotely determine a configuration of the batteries including a location of the batteries within the battery strings and in the battery pack based upon the collected configuration data from the wireless battery monitors and the wireless string monitors, and
        remotely process the collected diagnostic measurement data based upon the determined configuration of the batteries to determine battery fault conditions and string fault conditions, and generate alerts based thereon.

11. The battery monitoring system of claim 10 wherein the battery monitoring cloud server is further configured to remotely update the battery configuration based upon an addition or removal of wireless battery monitors and wireless string monitors over time.

12. The battery monitoring system of claim 10 wherein the battery monitoring cloud server is further configured to remotely cause the wireless battery monitors and wireless string monitors to initiate the battery diagnostic measurements and string diagnostic measurements, respectively, based upon the determined battery configuration.

13. The battery monitoring system of claim 10 further comprising a mobile wireless communications device configured to register the wireless battery monitors with respective batteries, and register the wireless string monitor with the at least one battery string.

14. A battery monitoring method for at least one battery string at a geographical location, the least one battery string comprising a plurality of series-connected batteries, the method comprising:

coupling a plurality of wireless battery monitors each to a respective battery;
coupling a wireless string monitor to the at least one battery string;
at a battery monitoring cloud server, communicating with a wireless access point via a wide area network (WAN) to
receive configuration data and diagnostic measurement data collected by the wireless access point from the wireless battery monitors and wireless string monitors and without local storage of the configuration data at the geographic location,
remotely determine a configuration of the batteries including a location of the batteries within the battery strings based upon the collected configuration data from the wireless battery monitors and the wireless string monitor, and
remotely process the collected diagnostic measurement data based upon the determined configuration of the batteries to determine battery fault conditions and string fault conditions, and generate alerts based thereon.

15. The method of claim 14 further comprising, at the battery monitoring cloud server, remotely updating the battery configuration based upon an addition or removal of wireless battery monitors and wireless string monitors over time.

16. The method of claim 14 further comprising, at the battery monitoring cloud server, remotely causing the wireless battery monitors and wireless string monitor to initiate the battery diagnostic measurements and string diagnostic measurements, respectively, based upon the determined battery configuration.

17. The method of claim 14 wherein the wireless battery monitors are configured to measure at least one of battery voltage, battery temperature, a change in battery voltage over time, a maximum battery voltage, a battery minimum voltage, and a battery internal resistance.

18. The method of claim 14 wherein the wireless string monitor is configured to measure at least one of a battery string voltage, a battery string current, a maximum string voltage, a minimum sting voltage, a maximum charge current, and a maximum discharge current.

19. The method of claim 14 further comprising locally storing the collected diagnostic measurement data at the wireless battery monitors and wireless string monitors until collected by the battery monitoring cloud server.

20. The method of claim 14 further comprising using a mobile wireless communications device to register the wireless battery monitors with respective batteries, and register the wireless string monitor with the at least one battery string.

21. A computing device comprising:
a memory and a processor cooperating with the memory and configured to
receive configuration data and diagnostic measurement data for a plurality of batteries series-connected within a battery string at a geographical location collected by a wireless access point at the geographical location from wireless battery monitors each associated with a respective battery and a wireless string monitor associated with the battery string and without local storage of the configuration data at the geographic location,
remotely determine a configuration of the batteries based upon the collected configuration data from the wireless battery monitors and wireless string monitors, and
remotely process the collected diagnostic measurement data based upon the determined configuration of the batteries to determine battery fault conditions and string fault conditions, and generate alerts based thereon.

22. The computing device of claim 21 wherein the processor is further configured to remotely update the battery configuration based upon an addition or removal of wireless battery monitors and wireless string monitors over time.

23. The computing device of claim 21 wherein the processor is further configured to remotely cause the wireless battery monitors and wireless string monitor to initiate the battery diagnostic measurements and string diagnostic measurements, respectively, based upon the determined battery configuration.

* * * * *